United States Patent
Wang et al.

(10) Patent No.: US 8,866,488 B2
(45) Date of Patent: Oct. 21, 2014

(54) POWER COMPENSATION IN 3DIC TESTING

(75) Inventors: Mill-Jer Wang, Hsin-Chu (TW); Ching Nen Peng, Hsin-Chu (TW); Hung-Chih Lin, Hsin-Chu (TW); Hao Chen, Luzhou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 811 days.

(21) Appl. No.: 13/053,951

(22) Filed: Mar. 22, 2011

(65) Prior Publication Data

US 2012/0242346 A1    Sep. 27, 2012

(51) Int. Cl.
  *G01R 31/02*   (2006.01)
  *G01R 31/3185* (2006.01)
  *G01R 31/28*   (2006.01)

(52) U.S. Cl.
  CPC ............... *G01R 31/318513* (2013.01); *G01R 31/2886* (2013.01)
  USPC ........... 324/537; 257/774; 257/777; 257/618; 257/48; 324/762.01; 324/762.09

(58) Field of Classification Search
  CPC ... H01L 23/481; H01L 23/60; H01L 25/0657; H01L 2224/0558; H01L 2225/06513; H01L 2225/06541; H01L 2225/06562
  USPC ....................................... 324/537
  See application file for complete search history.

(56) References Cited

U.S. PATENT DOCUMENTS

| 5,788,084 | A | 8/1998 | Onishi et al. |
| 7,902,852 | B1 * | 3/2011 | Hess et al. ............... 324/762.09 |
| 2008/0142990 | A1 * | 6/2008 | Yu et al. ......................... 257/777 |
| 2008/0238453 | A1 * | 10/2008 | Lo et al. ......................... 324/754 |
| 2010/0156453 | A1 * | 6/2010 | Doong et al. ................... 324/765 |
| 2011/0168995 | A1 * | 7/2011 | Doong et al. .................... 257/48 |
| 2011/0272788 | A1 * | 11/2011 | Kim et al. ..................... 257/618 |
| 2012/0068360 | A1 * | 3/2012 | Best ............................... 257/774 |
| 2012/0105093 | A1 * | 5/2012 | Lee ........................... 324/762.01 |

OTHER PUBLICATIONS

Van Der Klauw, K. L. M., et al., "Self-Multiplexing Force-Sense Test Structures for (MOS) IC Applications," International Conference on Microelectronic Test Structures, Mar. 1990, pp. 81-86, vol. 3, IEEE.
Van Der Klauw, K. L. M., et al., "Self-Multiplexing Force-Sense Test Structures for (MOS) IC Applications," International Conference on Microelectronic Test Structures, Transactions on Semiconductor Manufacturing, Aug. 1991, pp. 206-212, vol. 4, No. 3, IEEE.

(Continued)

*Primary Examiner* — Benjamin M Baldridge
(74) *Attorney, Agent, or Firm* — Slater & Matsil, L.L.P.

(57) ABSTRACT

A device, such as a 3DIC stacked device includes a first device under test (DUT) connected to a first force pad by a first through substrate via (TSV) stack and connected to a first sense pad by a second TSV stack. The device further includes a second DUT stacked above the first DUT and connected to a second force pad and a second force pad by a second third TSV and connected to a second sense pad by a fourth TSV. Functional blocks on either the first or second blocks can be accessed for testing by way of the TSVs. In some applications the TSVs are vertically aligned to form TSV stacks.

20 Claims, 6 Drawing Sheets

(56) References Cited

OTHER PUBLICATIONS

Werkmann, H., "Enabling the CPI Express™ ramp-ATE based testing of PCI Express architecture," Euro DesignCon, 2004, 26 pages, PCI-SIG®/Agilent Technologies.

Lowery, E., "RF Measurement Fundamentals—A New Series for go/semi," go/semi RF Measurement Series Introduction, Aug. 10, 2008, pp. 1-3, Verigy Wireless Center for Expertise, Austin, TX.

Maheshwary, R., "3D Stacking: EDA Challenges & Opportunities," Sematech Symposium, Sep. 2009, pp. 1-11, Synopsys, Tokyo, Japan.

Zhang, Q. et al., "Design of the Force Sense Unit for Space Robot End-effector," International Conference on Robotics and Biomimetics, Dec. 19-23, 2009, pp. 1727-1731, IEEE, Guilin, China.

Moreira, J., et al., "Testing High-Speed Digital Interfaces with Automated Test Equipment," Verigy Wireless Center for Expertise, 2010, pp. 1-8, Artech House, Inc.

Kanev, et al., "3D IC Test Challenges and Cascade Microtech Probing Solutions," 28 pages, CascadeMicrotech, 3D Integration Workshop, Mar. 12, 2010.

Lewis, D. L., et al., "Testing Circuit-Partitioned 3D IC Designs," School of Electrical and Computer Engineering, 6 pages, Georgia Institute of Technology, Atlanta, GA., IEEE Computer Society Annual Symposium on VLSI, May 13-15, 2009.

Newsom, Tom "Future ATE for System on a chip . . . some perspectives," IEEE, Test Conference, Proceedings. ITC 2003, vol. 1, Sep. 30-Oct. 2, 2003; 2 pages.

Sherry, Jeff et al., "Optimizing the Whole Test System to Achieve Optimal Yields and Lowest Test Costs," Electronics Manufacturing Technology Symposium, 2004. IEEE/CPMT/SEMI 29th International, Jul. 14-16, 2004, pp. 282-294.

\* cited by examiner

POWER COMPENSATION IN 3DIC TESTING

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required. An additional limit comes from the significant increase in the number and length of interconnections between devices as the number of devices increases. When the number and length of interconnections increase, both circuit RC delay and power consumption increase.

Three-dimensional (3D) integrated circuits (ICs) are therefore created to resolve the above-discussed limitations. In a typical formation process of 3D IC, a plurality of wafers, each including an integrated circuit, are formed. The wafers are then bonded with the devices aligned. Much higher device density has been achieved using 3D IC technology. Accordingly, 3D IC technology has the potential of being the mainstream technology of the next generation.

Through-substrate vias (TSV) are formed to interconnect devices on the substrates of wafers. Up to six layers of wafers have been bonded in current practices while more may be following. For a plurality of layers of wafers of a 3DIC, the middle layers are called interlayers, which lie between a top layer and a bottom layer of the 3DIC. Each layer of a 3DIC typically contains a chip of that layer.

Other technologies for 3D IC exist too, such as Die-on-Wafer and Die-on-die. For Die-on-Wafer technology, electronic components are built on two semiconductor wafers. One wafer is diced; the singulated dies are aligned and bonded onto die sites of the second wafer. An advantageous feature of the die-to-wafer bonding is that the size of dies may be smaller than the size of chips on the wafer. During a typical die-to-wafer bonding process, spaces will be left between the dies. The spaces are typically filled with a coating, such as spin-on-glass. As in the wafer-on-wafer method, thinning and TSV creation are performed either before or after bonding. Additional dies may be added to the stacks before dicing. For Die-on-Die technology, electronic components are built on multiple dies, which are then aligned and bonded. Thinning and TSV creation may be done before or after bonding.

Automatic Test Equipment (ATE), or testers are used in the process of automatically testing the electrical characteristics and performance of finished devices known as the Device Under Test (DUT). ATEs can be applied to 3DICs where the DUT is a 3DIC. In general, an ATE consists of an elaborate controller or microprocessor-based system that controls: 1) boards or modules that can supply electrical excitation to the device under test (DUT) and 2) boards or modules that can measure the electrical characteristics and behavior of the DUT in response to the applied excitation.

Force-sense is a measurement technique wherein a power (voltage or current) is forced at a point in the circuit, or a test pad, and the resulting power (voltage or current) is measured at the same point. Force is to apply a specific stimulus to a DUT pin, while sense is to measure the resulting current or voltage. A sensing path or a channel is a single testing path dedicated by an automatic test equipment to one device-under-test (DUT) pin so that the power applied to the DUT pin goes through a functional path inside the DUT and is sensed at a pin by the sensor of the ATE.

There are various forms of testing. Diagnostic tests are tests performed to check if a system is malfunctioning and if so, to determine the possible cause(s) of the malfunction and the corresponding repair strategy. Functional testing on the other hand is the process of testing a device for its ability to perform its intended function.

An ATE can be a complicated system capable of automatically testing and diagnosing faults in sophisticated electronic packaged parts or on wafer testing, including system-on-chips and integrated circuits. An ATE can perform functional testing as well.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Illustrative embodiments will be discussed with respect to three dimensional integrated circuit (3DIC) device structures and methods of testing such devices. Those of skill in the art will readily recognize that there are many variations which implement equivalent functions and the illustrative embodiments are made for illustrative purpose only.

Figure 1:
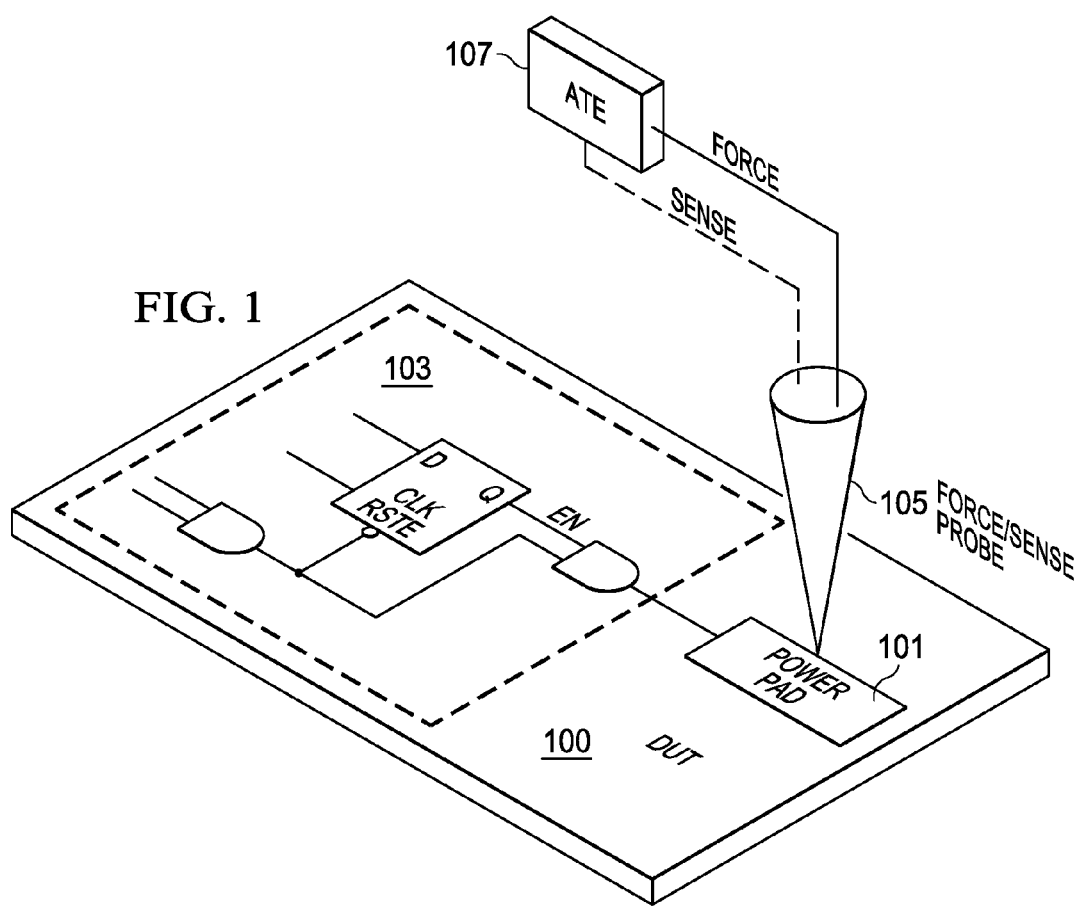
FIG. 1 depicts illustrative block diagrams of exemplary ATE and DUT which is a two dimensional (2D) Integrated Circuit (IC) with some exemplary details of DUT shown.

FIG. 1 illustrates a block diagram of an illustrative structure for a two dimensional integrated circuit and a testing method for the circuit. The Device Under Test (100 DUT) comprises a test pad 101 in addition to some exemplary circuits shown as 103 which are connected to the test pad 101. An Automatic Test Equipment (ATE) 107 comprises a power and sense probe 105 which can be connected to the test pad 101 of the DUT 100. During the testing of the DUT, power is applied by 107 ATE to the 105 force/sense probe which goes through the test pad 101 to test the function of the circuit 103. The feedback is sensed at the same pad 101 by the 105 force/sense probe.

Figure 2:
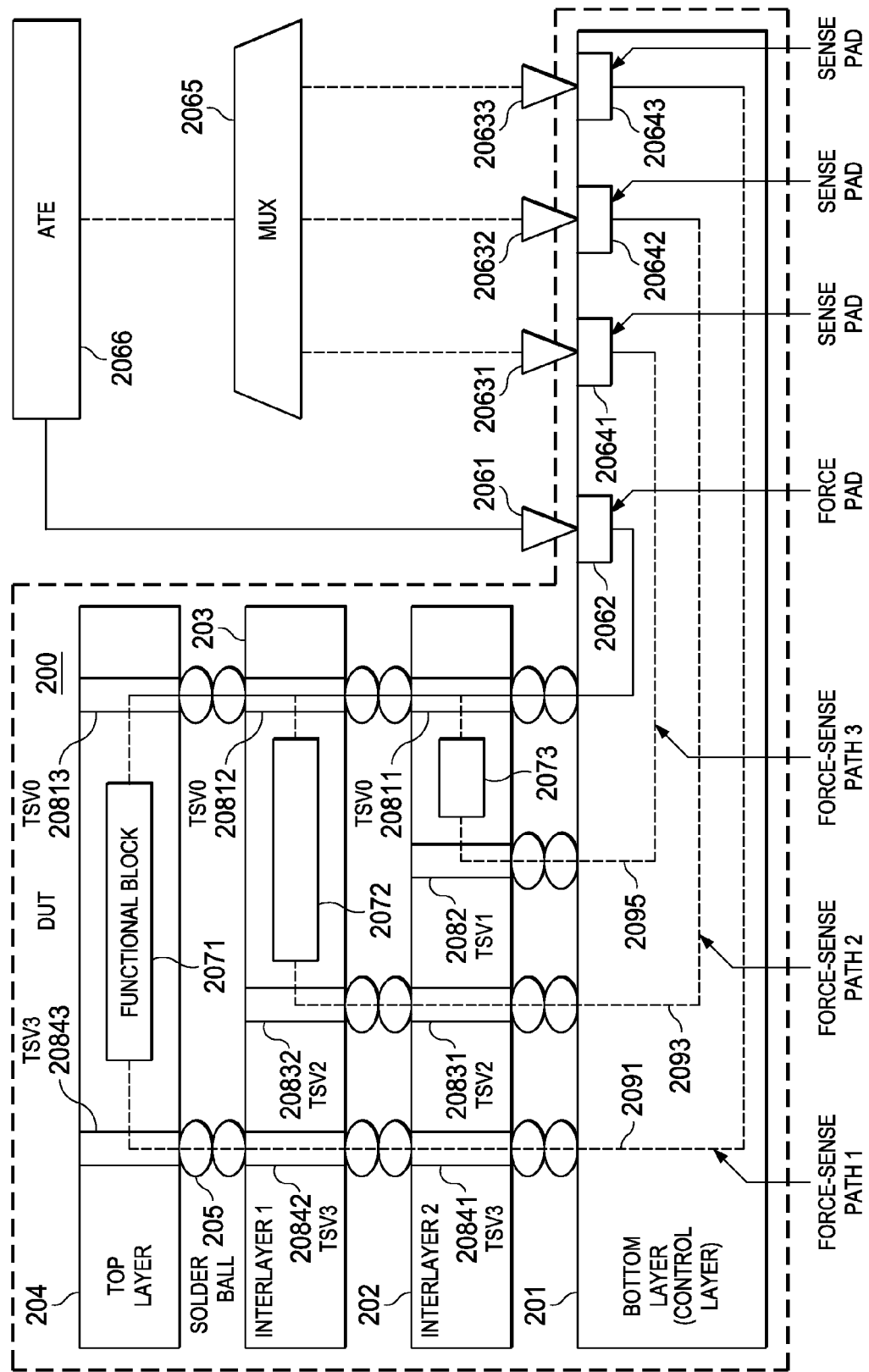
FIGS. 2-6 depict illustrative block diagrams of various exemplary embodiments of 3D IC structures with exemplary testing power supply and sensor structures; and The drawings, schematics and diagrams are illustrative and not intended to be limiting, but are examples of embodiments, are simplified for explanatory purposes, and are not drawn to scale.

FIG. 2 illustrates a block diagram of embodiment for a three dimensional integrated circuit device (3DIC) and a testing structure and method for the device. The 3DIC which is the Device Under Test (DUT) 200 comprises a top layer 204, an interlayer 203 which may be an interposer, an interlayer 202 which may be an active layer comprising a chip, and a bottom layer 201 which could be either an interposer or an active layer. A plurality of solder bumps and/or solder balls 205 are used to provide electrical connection between interposers, integrated circuit dies or wafer layers. One skilled in the art will recognize other types of electrical connection are within the contemplated scope of the invention. Throughout this description, any one layer of the top layer 204, the interposer layer 203, the active layer 202, and the bottom layer 201 may be referenced to as a DUT layer and collectively as the DUT layers. Within each DUT layer, there is an illustrative functional block which may be tested for functional test or diagnosis test purpose. For example, there is a functional block 2071 within the top layer 204, a functional block 2072 within the interlayer 1, and a functional block 2073 within the interlayer 2.

A plurality of through-substrate vias 20811-20813, 2082, 20831-20832, 20841-20843 (TSVs), and solder bumps 205 are used to connect the layers of chips (either in a wafer or a die) and interposers. Those TSVs form respective stacks and can be used for testing purposes. The TSV stack comprising 20811, 20812, and 20813 starts from the bottom layer 201 and reaches the top layer 204, and is connected to the functional block on each DUT layer. Therefore, this TSV stack comprising 20811, 20812, and 20813 is shared by all DUT layers for testing purposes. The TSV stack comprising 2082 starts from the bottom layer 201 and reaches the 202 interlayer 2 connecting to the functional block 2073. The TSV stack comprising 20831 and 20832 starts from the bottom layer 201 and reaches the 203 interlayer 1 connecting to the functional block 2072. The TSV stack comprising 20841, 20842, and 20843 starts from the bottom layer 201 and reaches the top layer 204 connecting to the functional block 2071.

Those of skill in the art will readily recognize that there are many variations which implement equivalent functions and the illustrative embodiments are made for illustrative purpose only. For example, a 3DIC could have more than four layers, and the layers could be positioned differently than as shown in FIG. 2. The number of TSVs, the number of solder bumps, and the positions of TSVs are all for illustration purpose only, and they could be easily changed to other equivalent positions which are readily recognized by those skilled in the art.

The Device Under Test (200 DUT) further comprises a force pad 2062, and a plurality of sense pads 20641, 20642, and 20643, which are all called test pads, located at the bottom layer 201, which is also called the control layer. A force probe 2061 of an ATE 2066 is connected to the force pad 2062, while a plurality of sense probes 20631, 20632, and 20633 of the ATE 2066 are connected to the sense pads 20641, 20642, and 20643, respectively. The operations of the sense probes are controlled by a MUX 2065 connected to the ATE 2066. The MUX 2065 controls that there is only one active sense path (i.e., connected to ATE 2066) for a DUT layer within the DUT device 200. Those of skill in the art will readily recognize that there are many variations which implement equivalent functions of the above FIG. 2 and the illustrative embodiment FIG. 2 is made for illustrative purpose only. For example, the force pad and the plurality of sense pads are located on the control layer which is shown as the bottom layer in FIG. 2. Other layers can be easily used as a control layer, which are not shown in the figure.

During the testing of any DUT layer of the DUT 200, power is applied by the ATE 2066 to the force probe 2061 which goes through the force pad 2062 to test a functional block in any DUT layer (e.g., 2071, 2072, 2073). The sense probes 20631, 20632, and 20633 controlled by the MUX 2065 and connected to the ATE 2066 sense the return signal from the test. Each of the sense pads is connected to one of the TSV stacks for the DUT layers. Therefore there is a dedicated sensing path for each DUT layer.

For illustrative purpose, in order to test the DUT layer 204 and the functional block 2071 within the layer 204, power is applied by the ATE 2066 to the force probe 2061, going through the force pad 2062 and the shared TSV stack comprising 20811, 20812, and 20813, and reaching the functional block 2071 within the DUT layer 204. After going through the functional block 2071, the power further goes through the TSV stack comprising 20843, 20842, and 20841, reaching the sense pad 20643, and is sensed by the sense probe 20633 which is controlled by the MUX 2065. The above path provides a dedicated path for the DUT layer 204. Throughout this description the term power should be interpreted broadly enough to include not only a voltage or current level, but also any form of digital or analog or mixed signal as well, either constant or time varying.

Similarly for illustrative purpose, in order to test the DUT layer 203 and the functional block 2072 within the layer 203, the power is applied by the ATE 2066 to the force probe 2061, going through the force pad 2062 and the shared TSV stack comprising 20811 and 20812, and reaching the functional block 2072 within the DUT layer 203. After going through the functional block 2072, the power further goes through the TSV stack comprising 20832 and 20831, reaching the sense pad 20642, and is sensed by the sensor probe 20632 which is controlled by the MUX 2065. The above path provides a dedicated path for the DUT layer 203. Note that sense pads 20643 and 20641 will be disconnected from ATE 2066 thus causing no interference with the testing of functional block 2072.

Similarly for illustrative purpose, in order to test the DUT layer 202 and the functional block 2073 within the layer 202, power is applied by the ATE 2066 to the force probe 2061, going through the force pad 2062 and the shared TSV stack comprising 20811, and reaching the functional block 2073 within the DUT layer 202. After going through the functional block 2073, the power further goes through the TSV stack comprising 2082, reaching the sense pad 20641, and is sensed by the sensor probe 20631 which is controlled by the MUX 2065. The above path provides a dedicated path for the DUT layer 202.

Figure 3:
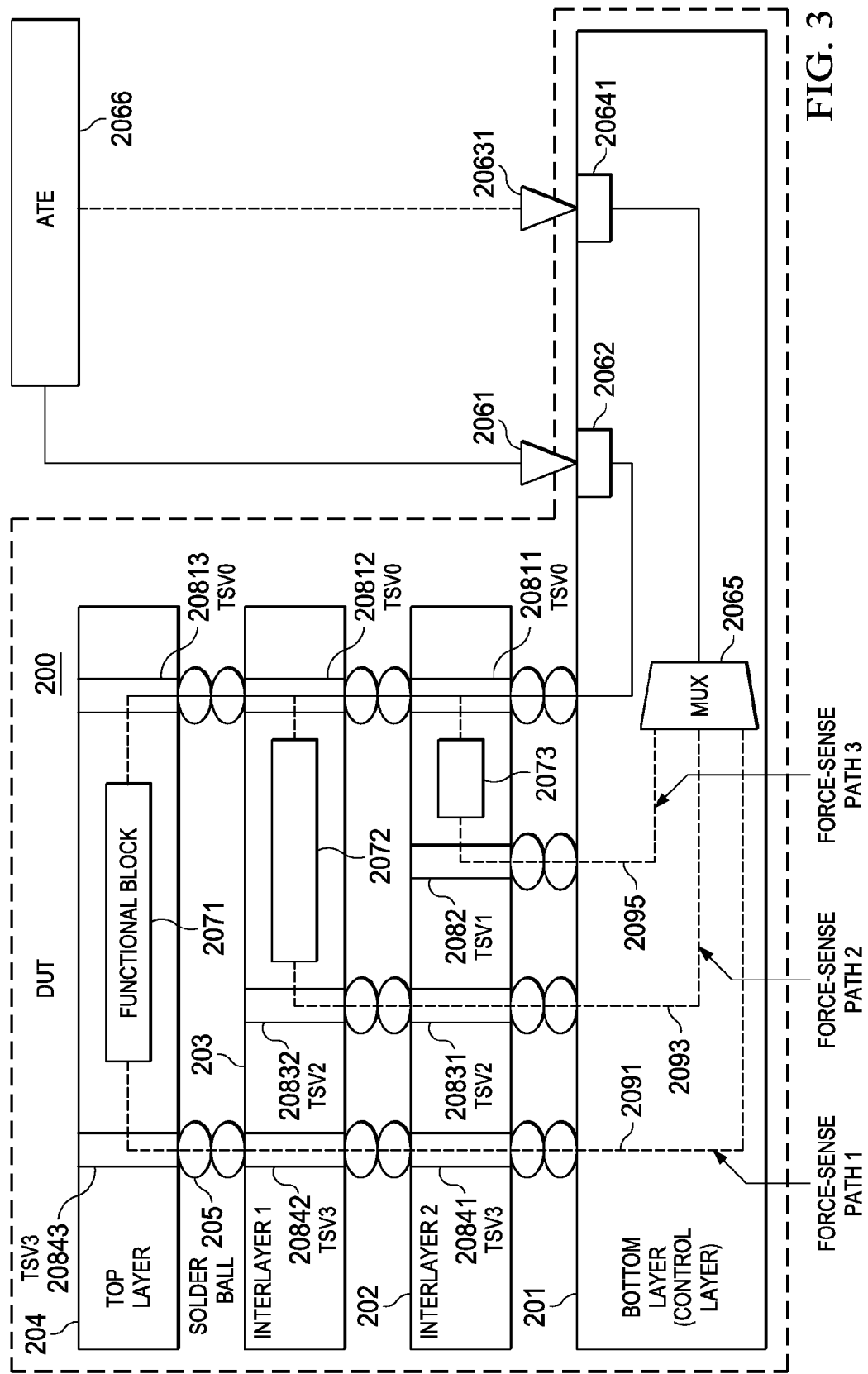

A dedicated sensing path for each DUT layer can be formed in other ways for testing purposes. FIG. 3 illustrates a block diagram of an illustrative structure of another embodiment for a three dimensional integrated circuit device (3DIC) and a testing structure and method for the device. For FIG. 3, the DUT layers, the functional blocks, the TSVs, the solder bumps, are all similar to those shown in FIG. 2. The MUX 2065 is located inside the control layer, which is the bottom layer in the illustrative figure, rather than outside the device as shown in FIG. 2. There is only one force pad 2062 and one sense pad 20641, compared to multiple sense pads 20641, 20642, and 20643 shown in FIG. 2. One skilled in the art will recognize that MUX 2065 can be controlled by appropriate control signals generated by ATE 2066 or by circuitry within any one of the CUT layers, or from an external source.

For illustrative purpose, in order to test the DUT layer 204 and the functional block 2071 within the layer 204, power is applied by the ATE 2066 to the force probe 2061, going through the force pad 2062 and the shared TSV stack comprising 20811, 20812, and 20813, and reaching the functional block 2071 within the DUT layer 204, similarly as shown in FIG. 2. After going through the functional block 2071, the power further goes through the TSV stack comprising 20843, 20842, and 20841, reaching the MUX 2065 and further reaching sense pad 20641, and is sensed by the sensor probe 20631. The above path provides a dedicated path for the DUT layer 204. Other dedicated path for other DUT layers can be formed and controlled by the MUX in a similar fashion. Those of skill in the art will readily recognize that there are many variations which implement equivalent functions of the above FIG. 3 and the illustrative embodiment FIG. 3 is made for illustrative purpose only. For example, the force pad and the sense pad are located on the control layer which is shown as the bottom layer in FIG. 3. Other layers can be easily used as a control layer, which are not shown in the figure.

In FIG. 3, the MUX 2065 controls that there is only one active sense path for a DUT layer within the DUT device 200. The MUX 2065 can be a discrete component or an integrated circuit located within the control layer 201. The MUX can be implemented in any available logic function and technology. Those of skill in the art will readily recognize that there are many variations which implement equivalent functions of the above FIG. 3 and the illustrative embodiment FIG. 3 is made for illustrative purpose only.

Figure 4:
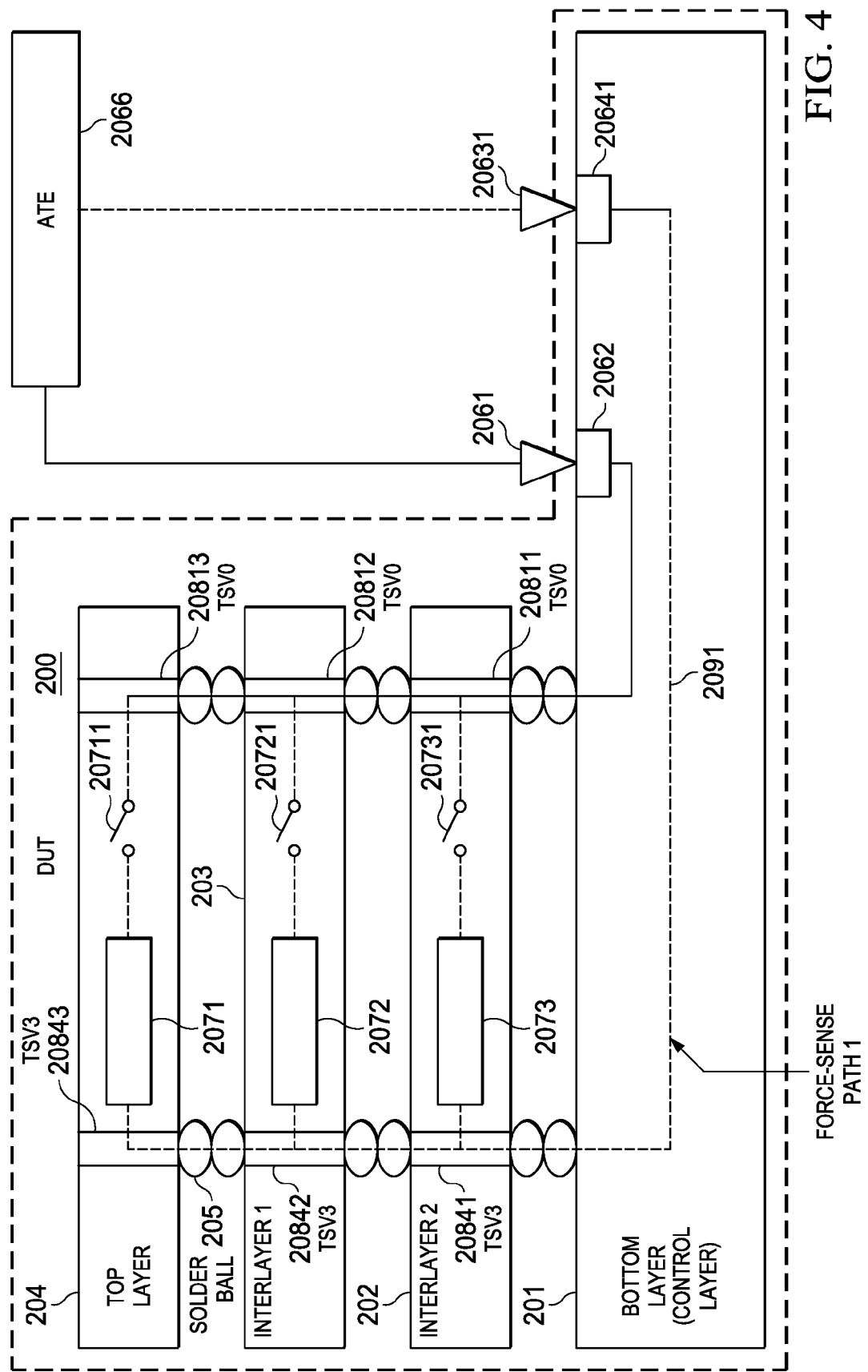

FIG. 4 further illustrates a block diagram of an illustrative structure of another embodiment for a three dimensional integrated circuit device (3DIC) and a testing structure and method for the device, where a dedicated sensing path for each DUT layer is formed by a dedicated switch within each respective layer, rather than formed by the use of a MUX either outside the DUT 200 or within DUT 200, as shown in FIGS. 2 and 3, respectively. For FIG. 4, the DUT layers, the functional blocks, the TSVs, the solder bumps, are all similar to those shown in FIG. 2. A switch 20711 connected to the function block 2071 is within the top layer 204, a switch 20721 connected to the functional block 2072 is within the interlayer 203, and a switch 20732 connected to the functional block 2073 is within the second interlayer 202. Two TSV stacks, one comprising of TSVs 20811, 20812, and 20813, another comprising of TSVs 20841, 20842, and 20843, are used in forming all the dedicated paths. All the dedicated paths share a force pad 2062 and a sense pad 20641. At any given time, there is only one dedicated sensing path active under test.

For illustrative purpose, in order to test the DUT layer 204 and the functional block 2071 within the layer 204, power is applied by the ATE 2066 to the force probe 2061, going through the force pad 2062 and the shared TSV stack comprising 20811, 20812, and 20813, and reaching the functional block 2071 within the DUT layer 204, via switch 20711, which is closed when testing block 2071. Switches 20721 and 20731 will be opened during this time so that blocks 2072 and 2073 do not interfere with the testing of block 2071. After going through the functional block 2071, the power further goes through the TSV stack comprising 20843, 20842, and 20841, reaching the sense pad 20641, and is sensed by the sensor probe 20631. Other dedicated paths for other DUT layers can be formed in a similar fashion by selecting the appropriate combination of closed and opened switches. Those of skill in the art will readily recognize that there are many variations which implement equivalent functions of the above FIG. 4 and the illustrative embodiment FIG. 4 is made for illustrative purpose only. For example, the force pad and the sense pad are located on the control layer which is shown as the bottom layer in FIG. 4. Other layers can be easily used as a control layer, which are not shown in the figure.

The switches in FIG. 4, 20711/20721/20731, are controlled respectively by a circuit in each stacked metal layer (not shown). Alternatively, these switches could be placed in left/right side of the functional blocks 2071/2072/2073 or inside the 2071/2072/2073 blocks respectively.

Figure 5:
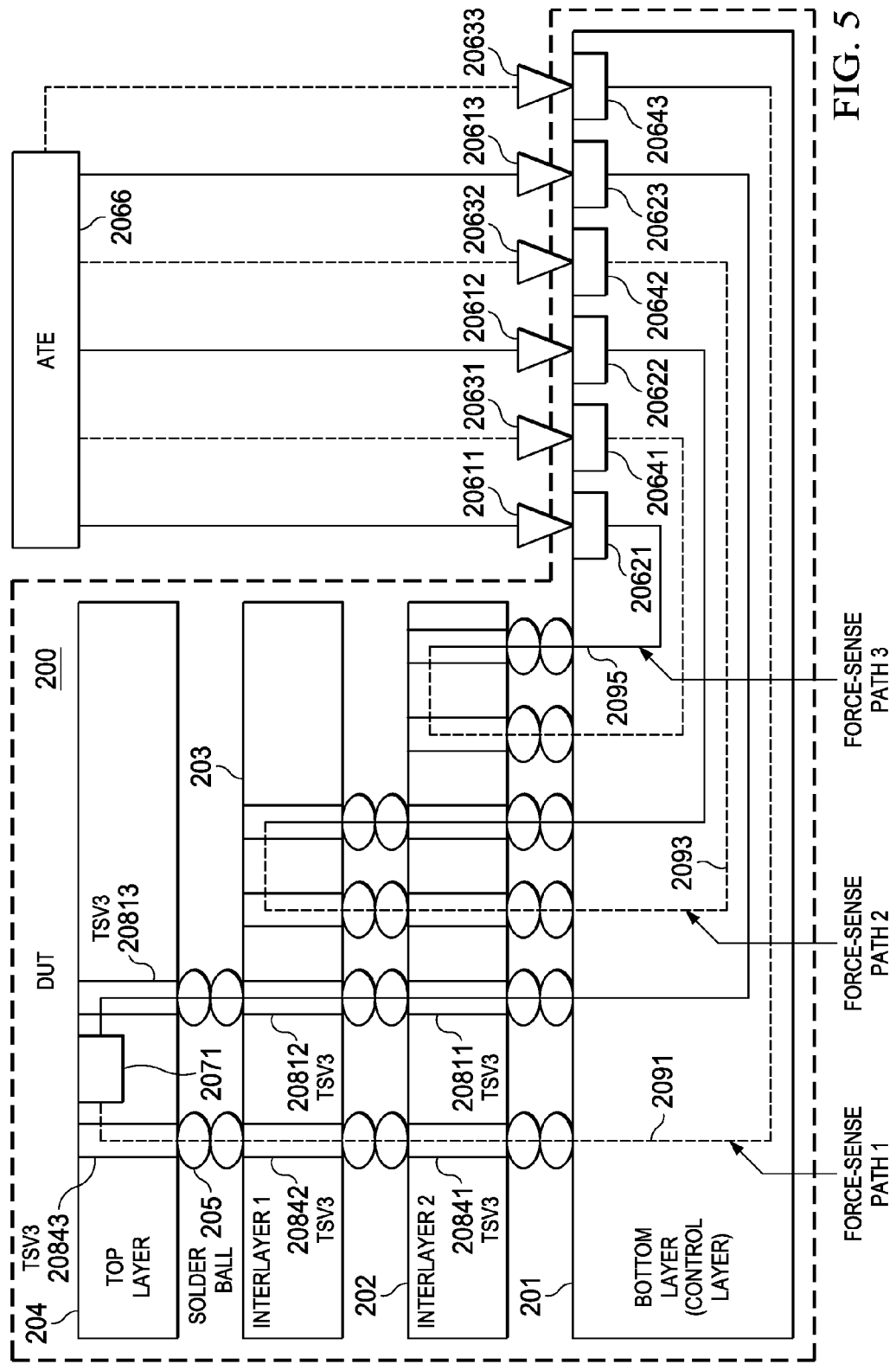

FIG. 5 further illustrates another embodiment for a three dimensional integrated circuit device (3DIC) and a testing structure and method for the device, where a dedicated sensing path for each DUT layer is formed by connecting the TSV of the layer, a dedicated force pad and a dedicated sense pad. For FIG. 5, the DUT layers which contain functional blocks (some not shown), the TSVs, the solder bumps, are all similar to those shown in FIG. 2. There are multiple force pads 20621, 20622, and 20623, and multiple sense pads 20641, 20642, and 20643, wherein one pair of force pad and sense pad is used to test one DUT layer using dedicated force probe and sense probe of the ATE 2066.

For illustrative purpose, in order to test the DUT layer 204 and the functional block 2071 within the DUT layer 204, power is applied by the ATE 2066 to the force probe 20613, going through the force pad 20623 and the TSV stack (not shared) comprising 20811, 20812, and 20813, and reaching the functional block 2071 within the DUT layer 204. After going through the functional block 2071, the power further goes through the TSV stack comprising 20843, 20842, and 20841, reaching the sense pad 20643, and is sensed by the sensor probe 20633. The above path provides a dedicated path for the DUT layer 204. Other dedicated paths for other DUT layers are provided in a similar fashion. Those of skill in the art will readily recognize that there are many variations which implement equivalent functions of the above FIG. 4 and the illustrative embodiment FIG. 4 is made for illustrative purpose only. For example, the force pad and the sense pad are located on the control layer which is shown as the bottom layer in FIG. 4. Other layers can be easily used as a control layer, which are not shown in the figure.

Figure 6:
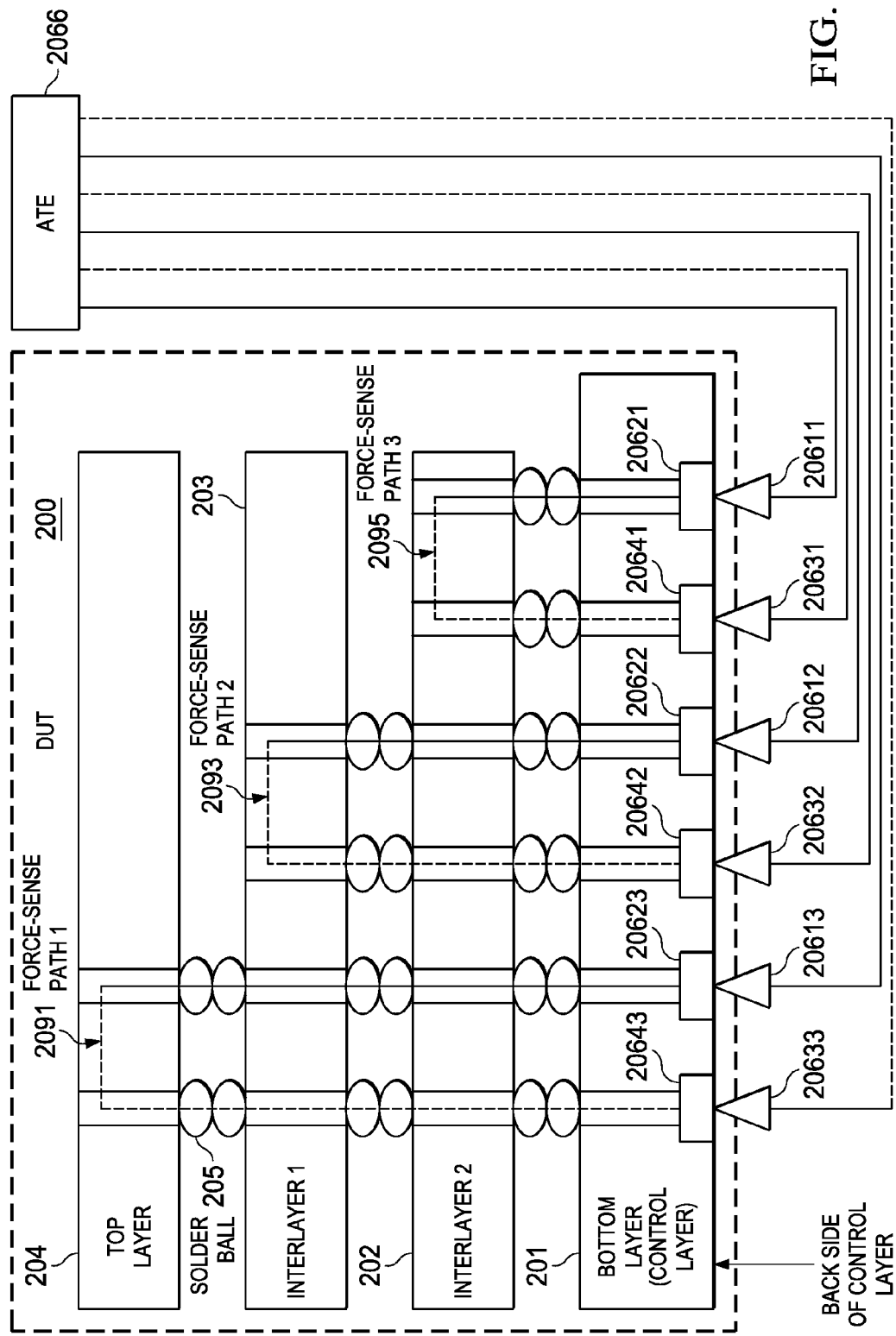

The force pads and sense pads of FIG. 5 can be located on a front side of the control layer as shown in FIG. 5. They could be located at a back side of the control layer as shown in FIG. 6 and transmit the power through the TSV of bottom layer. The control layer could be the bottom layer as shown in FIGS. 5 and 6, while it could be other layers such as a top layer or any of the interlayer.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus for testing 3DIC semiconductor devices comprising:
   a first semiconductor device under test (DUT) comprising a first terminal and a second terminal different from the first terminal, wherein the first terminal of the first DUT is connected to a first force pad on a control layer of the apparatus by a first through substrate via (TSV) stack and the second terminal of the first DUT is connected to a first sense pad on the control layer of the apparatus by a second TSV stack; and
   a second semiconductor DUT comprising a first terminal and a second terminal different from the first terminal, wherein the second DUT is stacked above the first DUT, wherein the first terminal of the second DUT is connected to a second force pad on the control layer of the apparatus by a third TSV and the second terminal of the second DUT is connected to a second sense pad on the control layer of the apparatus by a fourth TSV.

2. The device of claim 1, wherein the first TSV and the third TSV are a common TSV and the first force pad and the second force pad are a common force pad.

3. The device of claim 2, wherein the first sense pad and the second sense pad are a common sense pad.

4. The device of claim 1 further comprising:
   a multiplexer that receives a first input signal from the first sense pad and a second input signal from the second sense pad and that selectively outputs one of the first and second input signals as an output.

5. The device of claim 1, wherein the first TSV stack is a plurality of TSVs interconnected with solder bumps.

6. The device of claim 1, wherein the first DUT is an integrated circuit or an interposer.

7. The device of claim 1, further comprising:
   one or more additional DUTs stacked above the first and second DUTs and wherein each of the plurality of additional DUTs shares a common force pad.

8. The device of claim 7, wherein each of the additional DUTs shares a common sense pad.

9. A 3DIC device comprising:
   a first device under test (DUT) layer, including:
   a first terminal and a second terminal different from the first terminal;
   a first functional block,
   a first through substrate via (TSV) electrically coupled to the first functional block, and a second TSV electrically coupled to the first functional block;
   a second DUT layer, stacked atop the first DUT layer, and including:
   a first terminal and a second terminal different from the first terminal;
   a second functional block, a third TSV electrically coupled to the second functional block, and a fourth TSV electrically coupled to the second functional block;
   a force pad on a control layer of the device electrically coupled to the first functional block by way of the first and third TSV and the first terminal of the first DUT layer; and
   a sense pad on the control layer of the apparatus electrically coupled to the first functional block by way of the second TSV and the second terminal of the first DUT layer.

10. The device of claim 9, wherein the force pad is electrically coupled to the second functional block by way of the first and third TSV and the first terminal of the second DUT layer.

11. The device of claim 9, wherein the sense pad is electrically coupled to the second functional block by way of the second and fourth TSV and the second terminal of the second DUT layer.

12. The device of claim 11 further comprising a second sense pad and a multiplexer coupled to the first and second sense pad.

13. The device of claim 9 further comprising a switch between the first functional block and the first force pad.

14. The device of claim 9, wherein the first and third TSV form a first TSV stack and the second and fourth TSV form a second TSV stack.

15. The device of claim 9 wherein the force pad and the sense pad are located on a third DUT layer stacked above or below the first and second DUT layers.

16. A method of forming and testing a 3DIC device comprising:
    stacking a plurality of device under test (DUT) layers, wherein each DUT layer comprises a first terminal and a second terminal different from the first terminal;
    making electrical contact between a force pad and a respective functional block on each of the respective DUT layers by way of one or more through substrate via (TSV) stacks and the first terminal of the respective DUT layer;
    making electrical contact between a sense pad and the respective functional block on each of the respective DUT layers by way of one or more second through substrate via (TSV) stacks and the second terminal of the respective DUT layer;
    receiving a force signal from an external source at the force pad and coupling same to one or more of the functional blocks;
    passing the force signal through at least one of the functional blocks;
    sensing a sense signal from the at least one of the functional blocks; and
    sending the sense signal to the external source by way of the sense pad.

17. The method of claim 16 wherein the sense pad is a plurality of sense pads and further comprising:
    selecting one of the plurality of sense pads for sending the sense signal to the external source.

18. The method of claim 17 further comprising receiving a control signal from the external source to select one of the plurality of sense pads.

19. The method of claim 16 further comprising selecting one of the functional blocks to receive the force signal.

20. The method of claim 19 wherein selecting comprises closing a switch between a selected functional block and the force pad.

* * * * *